United States Patent [19]

Yoshida

[11] Patent Number: 4,791,612
[45] Date of Patent: Dec. 13, 1988

[54] DATA PROGRAMMING CIRCUIT FOR PROGRAMMABLE READ ONLY MEMORY DEVICE

[75] Inventor: Masanobu Yoshida, Kawaguchi, Japan

[73] Assignee: Fujitsu Limited, Kanagawa, Japan

[21] Appl. No.: 942,895

[22] Filed: Dec. 17, 1986

[30] Foreign Application Priority Data

Dec. 18, 1985 [JP] Japan .............................. 60-282735
Jan. 21, 1986 [JP] Japan .............................. 61-008964

[51] Int. Cl.$^4$ .............................................. G11C 7/00
[52] U.S. Cl. .................................... 365/189; 365/195
[58] Field of Search ..................... 365/189, 230, 195

[56] References Cited

U.S. PATENT DOCUMENTS

4,366,556  12/1982  Kyomasu et al. .................... 365/189

Primary Examiner—James W. Moffitt
Attorney, Agent, or Firm—Armstrong, Nikaido, Marmelstein & Kubovcik

[57] ABSTRACT

A programming circuit for a programmable read only memory device receiving a data signal to be programmed including a power supply terminal for receiving a first voltage in a read mode and a second voltage as a programming voltage which is a higher voltage than the first voltage in a program mode; an inverter circuit for converting an amplitude of the data signal in the program mode, the inverter including a load element and a first transistor having a drain connected to the load element and a gate receiving the data signal; and a switching circuit connected between the power source terminal and the load element for supplying the second voltage in the program mode and inhibiting a supply of the first voltage in the read mode.

5 Claims, 7 Drawing Sheets

DATA PROGRAMMING CIRCUIT FOR PROGRAMMABLE READ ONLY MEMORY DEVICE

BACKGROUND OF THE INVENTION

1. Field of the Invention

The present invention relates to a semiconductor memory device, more particularly, to a semiconductor memory device such as an electrically programmable read only memory (EPROM) provided with a data programming circuit for supplying a programming current to memory cells.

2. Description of the Related Art

In general, in an EPROM or other semiconductor memory device, in the program mode, predetermined data is programmed from a data programming circuit to a selected memory cell by storing, or not storing, electric charges in the floating gate of the cell transistor constituting the selected memory cell. On the other hand, in the read mode, the data programmed in the cell transistor is read out by sensing whether or not such electric charges are stored in the floating gate of the cell transistor constituting the selected memory cell.

That is, when programming data "0" in a selected cell transistor of the memory cell array, a programming current is supplied from a programming power source (having a programming potential $V_{pp}$) to the selected cell transistor through the data programming circuit, whereupon electrons are accumulated in the floating gate of the selected cell transistor. On the other hand, when programming data "1" in a selected cell transistor of the memory cell array, no programming current is supplied from the programming power source to the selected cell transistor and, therefore, electrons are not accumulated in the floating gate of the cell transistor.

In the above-mentioned conventional data programming circuit, however, in order to reduce the power consumption of the data programming circuit during the read mode, a complementary metal oxide semiconductor (CMOS) type inverter constituted by a P channel transistor and an N channel transistor is normally used as an inverter in the high potential circuit. When such a CMOS type inverter circuit is used, and the potential input to the inverter circuit is high level, the high level input potential is pulled up from $V_{cc}$ (for example, 5 V) to $V_{pp}$ (for example, 12.5 V) for stable operation of the inverter circuit. For this purpose, a feedback circuit which feeds back the potential of the output side of the inverter circuit to a pullup transistor is required. With the wiring for the feedback circuit, the wiring pattern of the data programming circuit becomes complicated. Usually, a large number of such wiring patterns are present on a chip, thus making it difficult to realize a small size of the integrated circuit as a whole. This has proven to be a problem.

Further, in general, the programming current during a program mode is determined by the I-V characteristic of the selected cell transistor (current and voltage characteristic between the drain and source of the selected cell transistor) and the load characteristics of the data programming circuit.

Therefore, looking at the I-V characteristic of the cell transistor, while the potential applied between the drain and source of the cell transistor is low, the predetermined current flows through the channel formed between the drain and source. In the program mode (for example, when programming data "0"), however, when a predetermined high potential (for example, 7.5 V) is applied to the drain of the cell transistor from the above data programming circuit, a so-called pinchoff phenomenon occurs and the channel near the drain disappears. An electric field having a high potential is caused there. The electrons, which are given a high energy in the electric field, cause so-called avalanche breakdown and the I-V characteristc of the cell transistor rapidly rises (the current rapidly increases). This large amount of hot electrons caused here is attracted to the floating gate due to the high potential (for example, 12.5 V) applied to the control gate of the cell transistor and is accumulated there. The value of the programming current supplied to the selected cell transistor from the above data programming circuit is determined by the intersection of the characteristic curve indicating the IV characteristic of the cell transistor and the characteristic curve indicating the load characteristics of the above data programming circuit.

However, the I-V characteristics of cell transistors, in particular the above rising portion, differ considerably depending on the gate length (distance between source and drain) of the cell transistors. When the gate length is short, the drain-source potential which initiates the avalanche breakdown falls. On the other hand, when the gate length is long, the drain-source potential which initiates the avalanche breakdown rises. In particular, along with the recent trend toward larger capacity memories, the cell transistors have been made finer in size and their gate lengths have become shorter, thereby resulting in further conspicuous variation in I-V characteristics. This in turn has led to a greater variation in the value of the programming current determined by the intersection of the above two characteristic curves and has resulted in the problem of an inability to ensure a stable programming operation.

SUMMARY OF THE INVENTION

The present invention was made to resolve the above-mentioned problem and has as its first object both the streamlining of the constitution of the high potential circuit inverters provided in the data programming circuits of a chip by constituting the above inverters by just a pair of N channel transistors through the provision of a single switching circuit on the chip for the supply of a predetermined operating potential to the data programming circuits, thereby enabling the integrated circuit as a whole to have a more compact wiring pattern, and enabling a reduction of the power consumption during the read mode.

According to the first aspect of the present invention for achieving this first object, there is provided a programming circuit for a programmable read only memory device receiving a data signal to be programmed including a power supply terminal for receiving a first voltage in a read mode and a second voltage as a programming voltage which is a higher voltage than the first voltage in a program mode; an inverter circuit for converting an amplitude of the data signal in the program mode, the inverter including a load element and a first transistor having a drain connected to the load element and a gate recevving the data signal; and a switching circuit connected between the power source terminal and the load element for supplying the second voltage in the program mode and inhibiting a supply of the first voltage in the read mode.

Through this construction, the addition of just a single switching circuit to the chip enables, in the program mode, supply, through that switching circuit, of a internal power source potential (programming potential) of a value about equal to the power source potential (for example, 12.5 V) supplied from the outside as the operating potential of the inverter circuit and programming current supplying circuit. On the other hand, in the read mode, the switching circuit inhibits the supply of that power source potential and prevents the consumption of power in the inverter circuit. Further, there is no need for a feedback circuit such as in a CMOS type inverter provided in the data programming circuit, and thus the integrated circuit as a whole may be made far more compact.

The present invention has as its second object the elimination of variations in the programming current based on variations in the I-V characteristics of the cell transistors by making the load characteristics of the data programming circuit in the program mode constant current characteristics, thus ensuring a stable programming operation.

To achieve the second object in addition to the first object, according to a second aspect of the present invention, there is provided a data programming circuit as described above further including a constant current source which is connected in series with the transistor provided in the programming current supplying circuit.

By this construction, as mentioned above, it is possible to reduce the power consumption in the read mode and to make the data programming circuit far more compact and, further, to make the load characteristics of the data programming circuit flat by the constant current characteristics of the constant current source and thus to eliminate variations in the programming current regardless of variations in the I-V characteristics of the cell transistors.

BRIEF DESCRIPTION OF THE DRAWINGS

The present invention will become clearer by way of the following description made in reference to the accompanying drawings, wherein.

DESCRIPTION OF THE PREFERRED EMBODIMENTS

Figure 1:
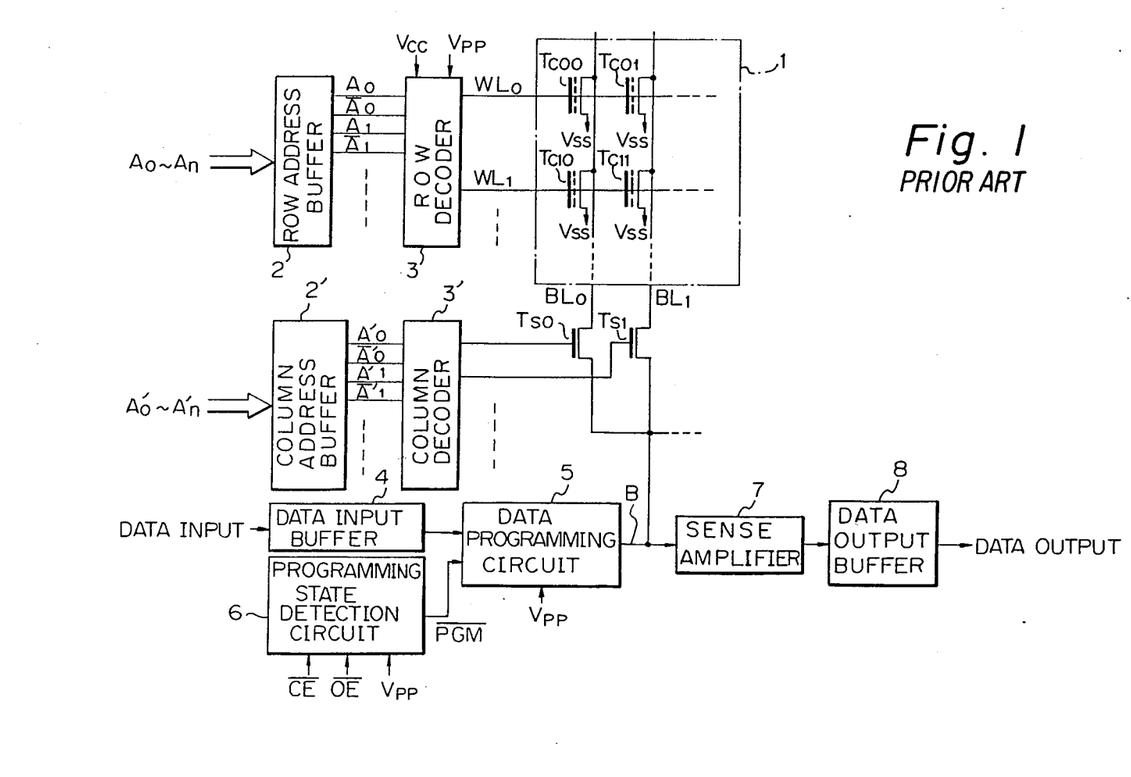
FIG. 1 is a view illustrating the overall construction of of a semiconductor memory device provided with EPROM memory cells.

To clarify the background of the present invention further, an example of the overall construction of this type of semiconductor memory device is shown schematically in FIG. 1. In FIG. 1, reference numeral 1 represents a memory cell array including a predetermined number of cell transistors $T_{C00}$, $T_{C01}$, ...; $T_{C10}$, $T_{C11}$...;... etc. Reference numeral 2 is a row address buffer, which row address buffer 2 shapes the waveforms of the row address bit signals $A_0$ to $A_n$ input therein and outputs internal row address bit signals $A_0$, $\bar{A}_0$ (inverted signal of $A_0$) to $A_n$, $\bar{A}_n$. Reference numeral 3 is a row decoder, which selects a specific word line, for example, $WL_0$, in accordance with the output states of the internal row address bit signals, and sets the potential of the selected word line $WL_0$ to, for example, the high level and the potential of the other nonselected word lines to, for example, the low level. In a program mode, the potential of the selected word line is made, for example, 12.5 V, by the programming DC power source $V_{pp}$, while, in a read mode, the potential of the selected word line is made, for example, 5 V by the read DC power source $V_{cc}$. The word line $WL_0$ is connected to the control gates of the cell transistors $T_{C00}$, $T_{C01}$, ..., while the word line $WL_1$ is connected to the control gates of the cell transistors $T_{C10}$, $T_{C11}$, ..., and so on.

On the other hand, reference numeral 2' is a column address buffer, which column address buffer 2' shapes the waveforms of the column address bit signals $A'_0$ to $A'_n$ input thereto and outputs internal column address bit signals $A'_0$, $\bar{A'}_0$ to $A'_n$, $\bar{A'}_n$. Reference numeral 3' is a column decoder, which selects a specific bit line, for example, $BL_0$ in accordance with the output states of the internal column address bit signals and supplies, for example, a high potential selection signal to the transfer gate transistor, for example, $T_{S0}$, connected to the selected bit line and sets the gate potential of the transfer gate transistors, for example, $T_{S1}$, connected to the other nonselected bit lines to the low level.

In the memory cell array 1, the cell transistors $T_{C00}$, $T_{C01}$, ...; $T_{C10}$, $T_{C11}$...;... constituting the memory cells are provided with floating gates (shown by dotted lines) in addition to the control gates connected to the word lines.

When programming data "0" is programmed into a predetermined cell transistor, for example, $T_{C00}$, a bit line $BL_0$ is selected by the column decoder 3', a word line $WL_0$ is selected by the row decoder 3, and a predetermined high potential (for example, 12.5 V) is applied to the control gate of the cell transistor $T_{C00}$. Further, a programming state detection signal $\overline{PGM}$ supplied from a programming state detection circuit 6 is input to the data programming circuit 5 and programming data "0" is input to the data programming circuit 5 via the data input buffer 4, whereby the potential of the output side of the data programming circuit 5 is made high level (for example, 7.5 V). (Note that when the programming state detection circuit 6 is supplied with a programming potential $V_{pp}$ and a low potential chip enable signal $\overline{CE}$ and high potential output enable signal $\overline{OE}$ are input to the circuit 6, the circuit 6 outputs a programming state detection signal $\overline{PGM}$ of the predetermined level (in this case, low potential). By this, the cell transistor $T_{C00}$ is made conductive, and the hot electrons generated by the ensuing avalanche breakdown are stored in the floating gate of the cell transistor $T_{C00}$ under the action of the high potential applied to the control gate of the cell transistor $T_{C00}$. As a result, cell transistors in which data "0" is programmed do not become conductive during the read mode even when the predetermined read potential (for example, 5 V) is applied to the control gate thereof through the word lines. By detecting this nonconductive state of the cell transistors, the fact that the data stored in the corresponding cell transistor is "0" is read out via a sense amplifier 7 and data output buffer 8.

On the other hand, when programming data "1" is programmed into a predetermined cell transistor, the data programming circuit 5 receives as input the programming state detection signal $\overline{PGM}$ supplied from the programming state detection circuit 6 and the programming data (in this case, "1") is input to the data programming circuit 5 via the data input buffer 4, whereby the output side of the data programming circuit 5 enters a floating state (0 V). By this, when programming data "1", the cell transistor $T_{C00}$ does not become conductive and no electrons are stored in the floating gate. Therefore, cell transistors in which data "1" is programmed become conductive during the read mode through application of the above predetermined read potential to the control gates via the word lines. By detecting this conductive state of the cell transistors, the fact that the data stored in the corresponding cell transistor is "1" is read out via the sense amplifier 7 and data output buffer 8.

Figure 2:
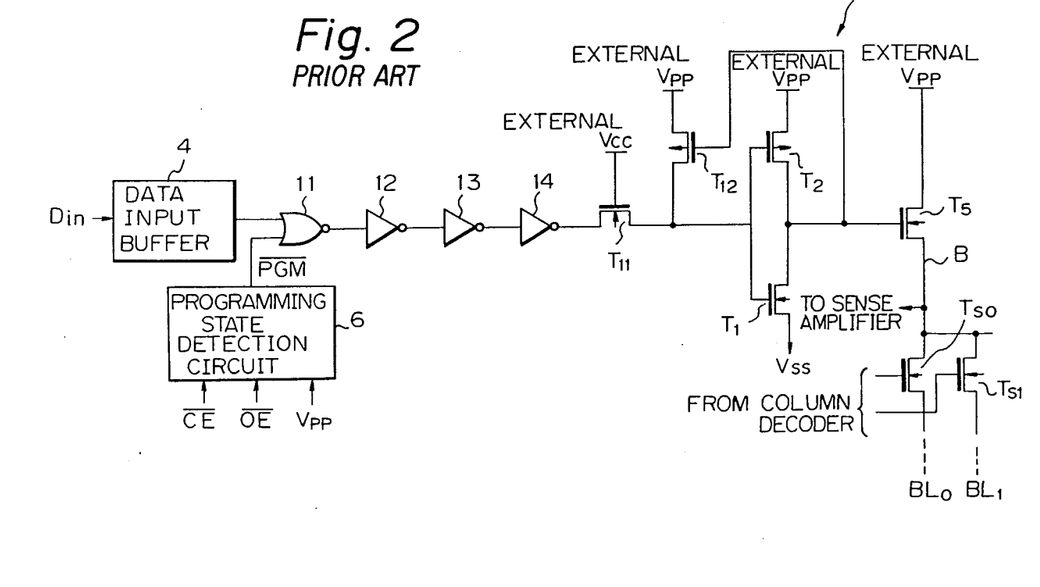
FIG. 2 is a circuit diagram illustrating an example of a conventional data programming circuit used for the semiconductor memory device shown in FIG. 1.

FIG. 2 shows a specific example of the data programming circuit 5 in a conventional semiconductor memory device, wherein a NOR circuit 11 receives as input the programming data $D_{in}$ via the data input buffer 4 and receives as input the programming state detection signal $\overline{PGM}$ from the programming state detection circuit 6.

When programming data "0" is programming into a selected cell transistor in the memory cell array, both the programming data $D_{in}$ and the programming state detection signal $\overline{PGM}$ become low potential and the output of the NOR circuit 11 becomes high potential. Then, the output of the NOR circuit 11 becomes low potential though the inverters 12, 13, and 14, which low potential signal is then passed through the tranffer gate transistor $T_{11}$ having a gate connected to an external power source $V_{cc}$ and is input to the CMOS inverter (high potential circuit inverter) constituted of a P channel transistor $T_2$ and an N channel transistor $T_1$ connected between an external power source having a potential of $V_{pp}$ and earth potential $V_{ss}$ for inversion. Thus, the resultant high potential output $V_{pp}$ (for example, 12.5 V) is input from the inverter to the gate of the N channel transistor $T_5$, the transistor $T_5$ becomes conductive, a programming current is supplied from the predetermined programming power source (having a programming potential of $V_{pp}$) through the bus B to the selected cell transistor, whereupon electrons are accumulated in the floating gate of the selected cell transistor. Further, the high potential signal of the output side of the inverter is input to the gate of the pullup transistor (P channel transistor) $T_{12}$ and the transistor $T_{12}$ is cut off.

Next, when write data "1" is programmed into a selected cell transistor, the programming data $D_{in}$ becomes high potential (programming state detection signal $\overline{PGM}$ is low potential) and the output of the NOR circuit 11 becomes low potential. Then, the output of the NOR circuit 11 becomes high potential (however, of a $V_{cc}$ level, e.g., 5 V) through the inverters 12, 13, and 14, which signal of the $V_{cc}$ level is then input through the transfer gate transistor $T_{11}$ to the CMOS inverter constituted of the P channel transistor $T_2$ and the N channel transistor $T_1$ for inversion. Due to the resultant low potential output (provisionally, 0 V), the pullup transistor (P channel transistor) $T_{12}$ turns on and the input potential of the CMOS inverter is pulled up from $V_{cc}$ to $V_{pp}$ (for example, 12.5 V). Further, the transistor $T_{11}$, which receives $V_{cc}$ at its gate, is cut off. By this, the input potential of the CMOS inverter becomes the above $V_{pp}$ and the output side of the CMOS inverter stabilizes at the low potential (0 V). Therefore, the transistor $T_5$ completely turns off. Thus, the cell transistor selected at that time is not supplied with a programming current and, therefore, electrons are not accumulated in the floating gate of the selected cell transistor.

Note that for the operating power source potentials of the pullup transistor $T_{12}$ and the CMOS inverter constituted of the pair of the transistors $T_1$ and $T_2$ and the programming power source potential supplied through the transistor $T_5$ to the selected cell transistor, a power source potential $V_{pp}$ (in FIG. 2, shown as external $V_{pp}$) is directly supplied from an external power source. Further, the gate of the transfer gate transistor $T_{11}$ is directly supplied from an external power source with the power source potential $V_{cc}$ (in FIG. 2, shown as external $V_{cc}$).

In the conventional data programming circuit mentioned above, however, in order to reduce the power consumption during the read mode, that is, while the programming state detection signal PGM is high potential, the inverter (high potential circuit inverter) is made of a CMOS type, i.e., is constituted of a P channel transistor $T_2$ and an N channel transistor $T_1$. Therefore, in order to pull up the input potential of the CMOS type inverter in the high potential mode from $V_{cc}$ to $V_{pp}$ to stabilize its operation, a circuit has been provided to feed back the potential of the output side of the CMOS type inverter to the gate side of the pullup transistor $T_{12}$. The wring pattern constituting that circuit, including the feedback wiring, thus has become complicated and, since there are usually large numbers of such wiring patterns on a single chip, it has become difficult to make the overall integrated circuit small in size.

Figure 3:
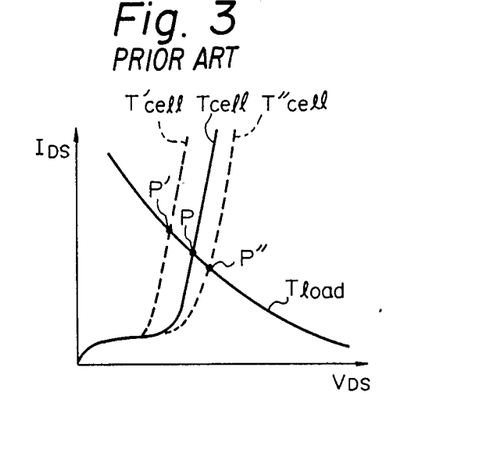
FIG. 3 is a view explaining the range of variation of programming current output from a data programming circuit.

FIG. 3 shows that I-V characteristic Tcell of the cell transistor, for example, $T_{C00}$, in the above conventional semiconductor memory device and the load characteristic Tload of the data programming circuit, i.e., the load characteristic defined by the transistor $T_5$ and the selected transfer gate transistor, e.g., $T_{S0}$, the horizontal axis $V_{DS}$ indicating the drain-source potential of the cell transistor and the vertical axis $I_{DS}$ indicating the drain-source current of the cell transistor. In the figure, as shown by the characteristic curve Tcell, a predetermined current $I_{DS}$ flows in the cell transistor through the channel formed between the drain and source while the potential $V_{DS}$ applied between the drain and source is comparatively low. In the program mode, for example, when programming data "0", as mentioned above, if a predetermined high potential, for example, 7.5 V, is applied to the drain from the data programming circuit 5, i.e., $V_{DS}$ becomes greater than a predetermined value, a so-called pinchoff phenomenon occurs and the channel near the drain disappears. An electric field having a high potential is caused there. The electrons, which are given a high energy in the electric field, collide with the crystal lattice and generate successive pairs of electrons and holes (so-called avalanche breakdown) and the I-V characteristic Tcell of the cell transistor rapidly rises. This large amount of hot electrons caused here is attracted to the floating gate of the cell transistor due to the high potential of, for example, 12.5 V, applied to the control gate, as mentioned above, and is accumulated there. .

The load characteristic of the data programming circuit, i.e., the load characteristic defined by the transistor $T_5$ and the transfer gate transistor selected at that time, for example, $T_{S0}$, is shown in FIG. 3 as Tload. Along with the rise of the potential $V_{DS}$ between the drain and source of the cell transistor, $I_{DS}$, i.e., the programming current, declines. The value of the programming current supplied to the predetermined cell transistor from the data programming circuit 5 is determined by the intersection P of the above two characteristic curves, i.e., Tcell and Tload.

However, the I-V characteristics of cell transistors, in particular the above rising portion, differ considerably depending on the gate length of the cell transistors (distance between source and drain). When the gate length is short, the drain-source potential which initiates the avalanche breakdown falls (see curve T'cell). On the other hand, when the gate length is long, the drain-source potential which initiates the avalanche breakdown rises (see curve T''cell.) In particular, along with the recent trend toward larger capacity memories, the cell transistors have been made finer in size and their gate lengths have become shorter, thereby resulting in further conspicuous variation in I-V characteristics. The intersection of the above two characteristic curves, i.e., Tcell and Tload, thus varies as much as in the range of P' to P'', leading to a correspondingly greater variation in the value of the programming current $I_{DS}$ and making it impossible to ensure a stable programming operation.

Figure 4:
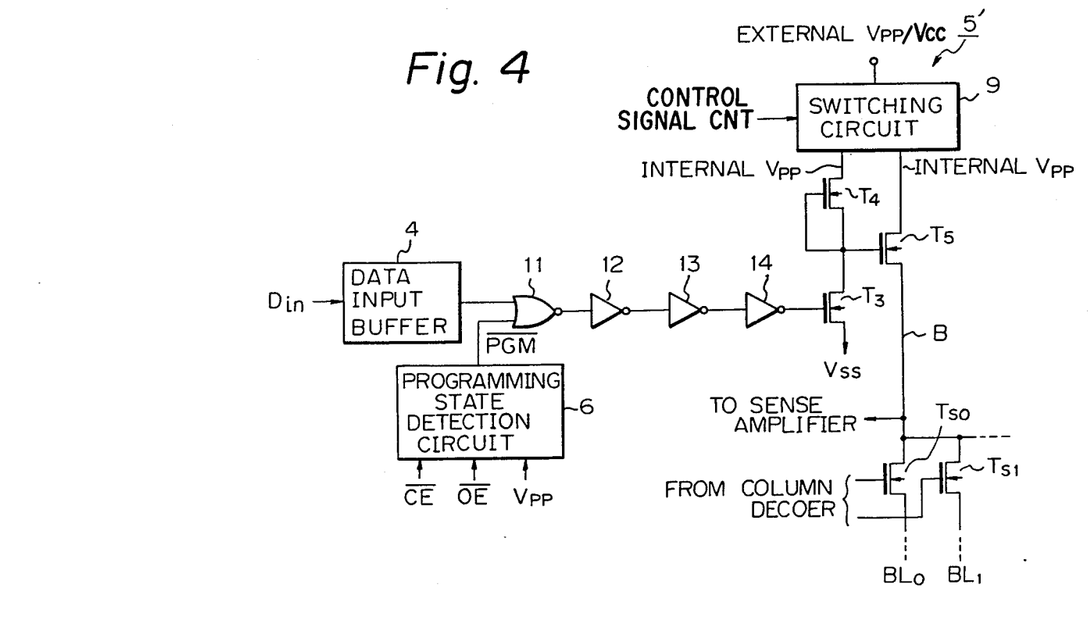
FIG. 4 is a circuit diagram of a data programming circuit of an embodiment of the present invention used for the semiconductor memory device shown in FIG. 1.

The present invention was made to resolve these problems. FIG. 4 shows the basic constitution of a data programming circuit 5' according to an embodiment of the invention. As shown in FIG. 4, in the present invention, the CMOS type inverter, constituted of transistors $T_1$ and $T_2$, provided in the conventional data programming circuit 5, is replaced with an inverter circuit constituted of a pair of N channel transistors $T_3$ and $T_4$ (a gate and a source of the transistor $T_4$ are connected in common) and, further, a single switching circuit 9 provided on a chip. In the program mode, the switching circuit 9 supplies, by a predetermined control signal CNT, an external power source potential (in FIG. 4, shown as external $V_{pp}$) to the data programming circuit 5' as its operating power source potential, that is, the operating power source potential of the inverter circuit constituted of the pair of N channel transistors $T_3$ and $T_4$ and the operating power source potential of the circuit supplying programming current through the N-channel transistor $T_5$ to the predetermined cell transistor, shown in FIG. 4 as internal $V_{pp}$. In the read mode, the switching circuit 9, again by the control signal CNT, inhibits the supply of the above operating power source potential to the data programming circuit 5'.

Figure 5:
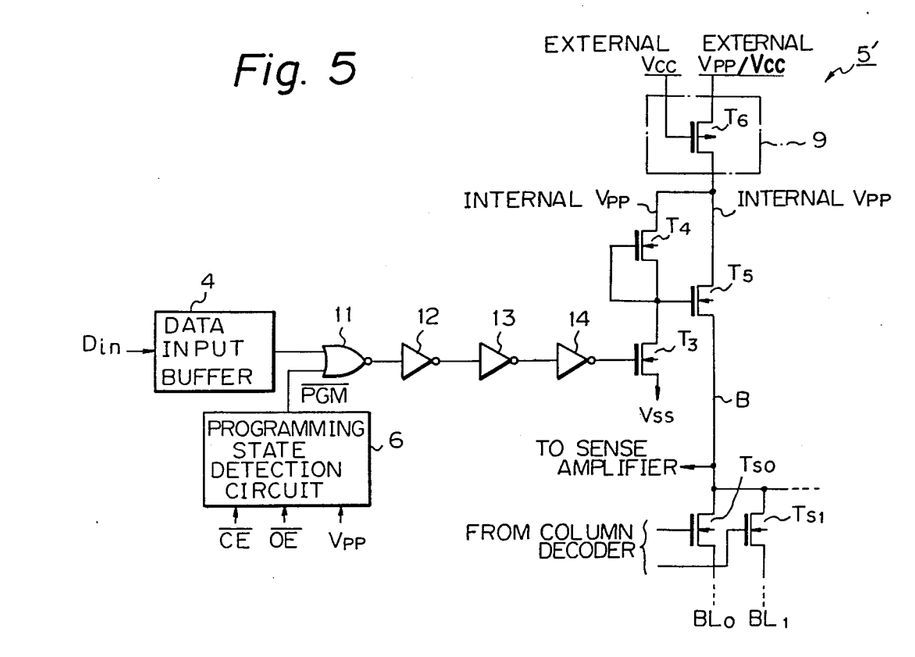
FIG. 5 is a circuit diagram of a specific example of a switching circuit in the data programming circuit shown in FIG. 4.

FIG. 5 shows a specific, good example of the switching circuit 9. As such switching circuit 9, use is made of a P channel transistor $T_6$ provided on the chip (single transistor provided on the chip). Its drain potential is used as the internal $V_{pp}$. The source of the P channel transistor $T_6$ is supplied from the external power source with a potential $V_{pp}$ (shown in FIG. 5 as external $V_{pp}$ and changed in value in the program mode and read mode). Further, its gate is supplied from the external power source with a potential $V_{cc}$ (shown in FIG. 5 as external $V_{cc}$). The external $V_{pp}$ supplied to the source of the P channel transistor $T_6$ is, for example, made 12.5 V in the program mode and, for example, 5 V in the read mode (same value as external $V_{cc}$ supplied to the gate) through external switching before supply to the source.

Therefore, in the program mode, the source of the P channel transistor $T_6$ is made a higher potential than the gate, so the P channel transistor $T_6$ turns on and an internal $V_{pp}$ (12.5 V) of about the same value as the external $V_{pp}$ is supplied as the operating power source potential of the high potential circuit inverter of the data programming circuit 5' (inverter constituted by pair of N channel transistors $T_3$ and $T_4$) and the programming power source potential supplying a predetermined programming current through the transistor $T_5$ to the cell transistor. On the other hand, in the read mode, the source potential of the P channel transistor $T_6$ becomes equal to the gate potential, whereupon the transistor $T_6$ turns off and its drain potential (internal $V_{pp}$) enters a floating state (0 V).

In the data programming circuits of both FIG. 4 and FIG. 5, when programming data "0" is programmed into a selected cell transistor in the memory cell array, the programming data $D_{in}$ and programming state detection signal $\overline{PGM}$ both become low potential, the output side of the NOR circuit 11 becomes high potential, and then, then output of the NOR circuit 11 becomes low potential through the inverters 12, 13, and 14. The low potential signal is inverted by the inverter constituted by the pair of N channel transistors $T_3$ and $T_4$. As a result, the transistor $T_5$ becomes conductive and a programming current is supplied from the predetermined programming power source (internal $V_{pp}$ made 12.5 V, for example, in program mode) through the bus B to the selected cell transistor. On the other hand, when programming data "1" is programmed in the selected cell transistor, the programming data $D_{in}$ becomes high potential (programming state detection signal $\overline{PGM}$ is low potential). As a result, the output side of the inverter constituted by the pair of N channel transistors $T_3$ and $T_4$ becomes low potential and the transistor $T_5$ turns off. The cell transistor selected at that time is not supplied with programming current.

On the other hand, in the read mode, the programming state detection signal $\overline{PGM}$ becomes high potential and the output side of the NOR circuit 11 becomes low potential at all times. As a result, the gate of the N channel transistor $T_3$ constituting the high potential circuit inverter receives as input a high potential signal. At that time, the operating potential (internal $V_{pp}$) of the inverter is brought to a floating state (0V) as mentioned above, so in the read mode, the inverter constituted by the pair of N channel transistors $T_3$ and $T_4$ has no current passed after the potential of the output side is made 0 V and thus an increase in the power consumption in the read mode can be prevented.

According to the embodiments shown in FIG. 4 and FIG. 5, the addition of just a single switching circuit, for example, the P channel transistor $T_6$ to the chip, enables formation of the memory cell data programming circuits provided in large numbers on the chip, using a compact wiring pattern, and, thus, enables the integrated circuit as a whole to be made far more compact, without causing an increas in the power consumption in the read mode.

Figure 6:
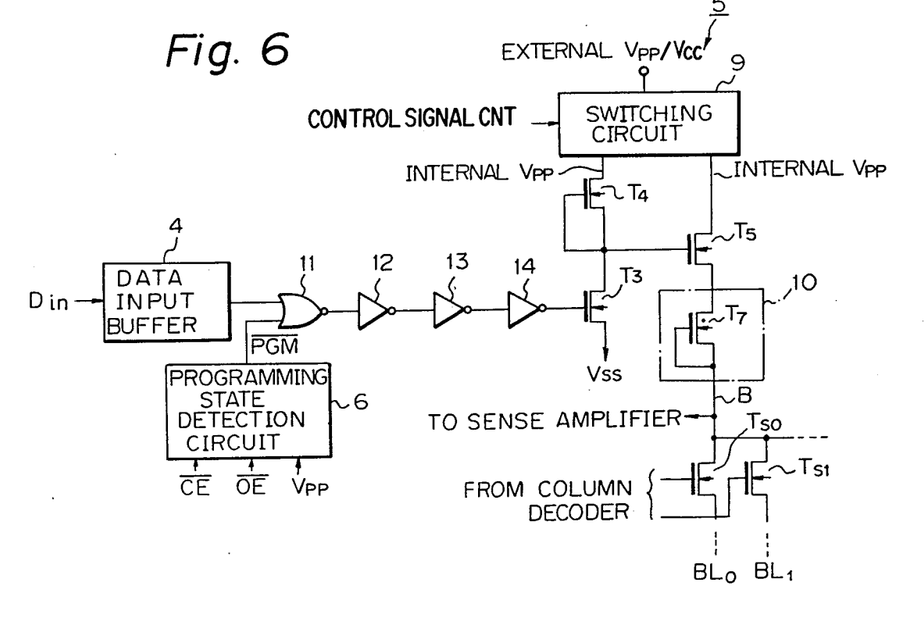
FIG. 6 is a circuit diagram of a data programming circuit of another embodiment of the present invention used for the semiconductor memory device shown in FIG. 1.

FIG. 6 shows a specific construction of a data programming circuit 5" of another embodiment of the present invention. The difference from the data programming circuit 5' shown in FIG. 4 and FIG. 5 lies in the provision of a constant current source 10 in the circuit for supplying a programming current from the programming operation power source (internal $V_{pp}$) to the selected memory cell (that is, selected cell transistor) through the predetermined transfer gate transistor, for example, $T_{S0}$. As the constant current source 10, use is made in the embodiment of FIG. 6 of a depletion type N channel transistor $T_7$ with a commonly connected gate and source.

Figure 7:
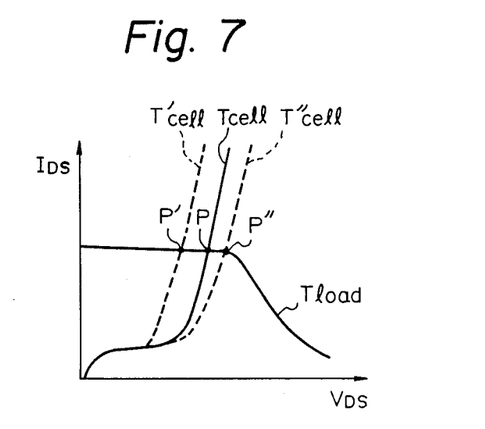
FIG. 7 is a view explaining the range of programming current output from a data programming circuit provided with a constant current source such as shown in FIG. 6 and FIG. 8.

Therefore, in the present invention, the provision of the constant current source 10, for example, the above depletion type N channel transistor $T_7$, enables, based on the constant current characteristics of the constant current source 10, the load characteristic of the data programming circuit, i.e., the load characteristic defined by the transistors $T_5$ and $T_7$ and the transfer gate transistor selected at that time, e.g., $T_{S0}$, to be made flat in the range of the potential $V_{DS}$ between the drain and source in the program mode, as shown by the characteristic curve Tload in FIG. 7.

Therefore, even if the I-V characteristics Tcell of the cell transistors vary within the range of from T'cell to T"cell, the intersection P of the characteristic curves Tcell and Tload will only vary within the range of P' to P" in FIG. 7 and thus it is possible to almost completely eliminate the variation in the corresponding programming current $I_{DS}$.

Figure 8:
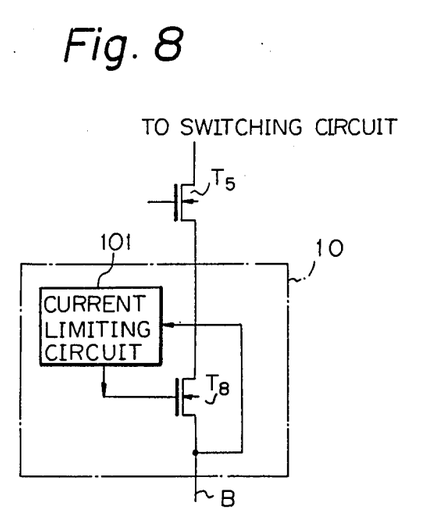
FIG. 8 is a circuit diagram of a modification of the circuit constituting the constant current source in the data programming circuit shown in FIG. 6.
Figures 9A, 9B:
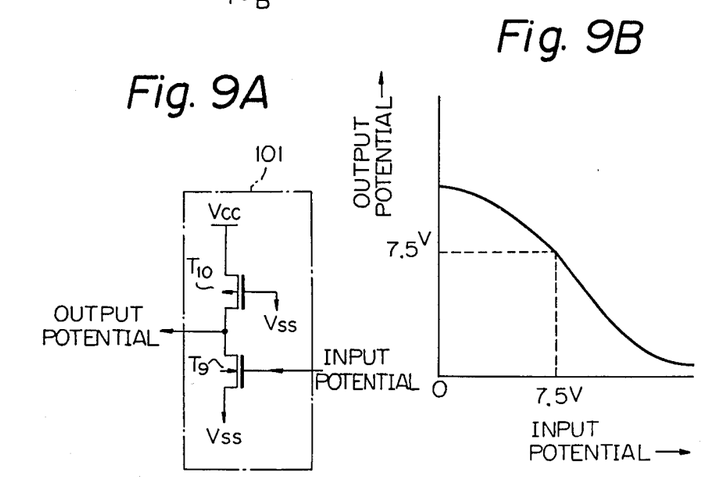
FIGS. 9(A) and 9(B) are a circuit diagram of a specific example of a current limiting circuit shown in FIG. 8 and a view of its input-output potential characteristic.

FIG. 8 shows another example of the constant current source 10 shown in FIG. 6. In the constant current source 10 shown in FIG. 8, the potential of the but B which supplies programming current from the data programming circuit to the selected cell transistor is input to the current limiting circuit 101, the output potential of the current limiting circuit 101 being fed back to the gate of the N channel transistor $T_8$. As the current limiting circuit 101, use is made of an inverter circuit constituted by a P channel transistor $T_{10}$ having a gate supplied with earth potential $V_{ss}$ and an N channel transistor $T_9$, as shown in FIG. 9(A). Input potential from the bus B is supplied to the gate of the transistor $T_9$ and the output potential taken out from the node of the transistors $T_9$ and $T_{10}$ is supplied to the gate of the transistor $T_8$ provided in the programming current supplying circuit. When the potential of the bus B rises over the value at the time of programming data "0" (e.g., 7.5 V), the potential supplied to the gate of the transistor $T_8$ is reduced by the current limiting circuit. Conversely, when falling below the value at the time of programming data "0" (7.5 V), the potential supplied to the gate of the transistor $T_8$ is raised by the current limiting circuit, with the circuit thus functioning as a constant current source. FIG. 9(B) shows the relationship between the input potential and output potential of the above current limiting circuit.

According to the embodiment shown in FIG. 6 to FIG. 9, an increase in the power consumption in the read mode can be prevented and further the data programming circuit can be made using compact wiring patterns, enabling a far more compact integrated circuit as a whole. Not only that, but it enables elimination of variations in the programming current supplied to the memory cell transistors from the data programming circuit in the program mode, even if there are variations in the I-V characteristics of the memory cell transistors, and therefore, ensures a stable programming operation.

I claim:

1. A programming circuit for a programmable read only memory device receiving a data signal to be programmed, said circuit comprising:
    means for receiving the data signal;
    a power supply terminal for receiving a first voltage in a read mode and a second voltage as programming voltage which is a higher voltage than said first voltage in a program mode;
    an inverter circuit for inverting said data signal in said program mode, said inverter including a load element and a first transistor having a drain connected to said load element and a gate connected to said means for receiving said data signal; and
    a switching circuit connected between said power supply terminal and said load element for supplying said second voltage to the load element in said program mode and inhibiting a supply of said frist voltage to the load element in said read mode.

2. A programming circuit according to claim 1, wherein said switching circuit comprises a P channel transistor having a source connected to said power supply terminal, a drain connected to said load element, and a gate connected to voltage supplying means for supplying a voltage to the gate such that said P channel transistor is turned off when the first voltage is supplied to said power supply terminal.

3. A programming circuit according to claim 1, further comprising a second transistor having gate connected to said drain of said first transistor, a drain connected to said switching circuit, and a source for outputting a programming current in response to said data signal.

4. A programming circuit according to claim 3, further comprising a constant current source which is connected in series with said second transistor.

5. A programming circuit according to claim 4; wherein said constant current source comprises a depletion type transistor having a gate and a source connected in common.

* * * * *